(12) United States Patent
Cheng et al.

(10) Patent No.: US 8,292,697 B2
(45) Date of Patent: Oct. 23, 2012

(54) METHOD FOR MANUFACTURING A HYBRID COMPOSITE WAFER CARRIER FOR WET CLEAN EQUIPMENT

(75) Inventors: Wing Lau Cheng, Sunnyvale, CA (US); Helen Cheng, legal representative, Sunnyvale, CA (US); Arnold Kholodenko, San Francisco, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/403,839

(22) Filed: Feb. 23, 2012

(65) Prior Publication Data

US 2012/0168079 A1 Jul. 5, 2012

Related U.S. Application Data

(62) Division of application No. 11/743,516, filed on May 2, 2007, now Pat. No. 8,146,902.

(60) Provisional application No. 60/876,631, filed on Dec. 21, 2006.

(51) Int. Cl.
 *B24B 1/00* (2006.01)
(52) U.S. Cl. ............................ 451/28; 428/74; 428/300.7
(58) Field of Classification Search .................. 269/900, 269/901, 289 R; 264/45.1; 451/28; 428/268, 428/381, 74, 300.7, 114, 192, 298.1, 299.1, 428/323, 327
See application file for complete search history.

(56) References Cited

U.S. PATENT DOCUMENTS

| | | | | |
|---|---|---|---|---|
| 4,609,285 A * | 9/1986 | Samuels | .......................... | 355/75 |
| 4,715,408 A * | 12/1987 | Eisenlohr | ........................ | 139/54 |
| 4,901,011 A * | 2/1990 | Koike et al. | .............. | 324/756.02 |
| 5,185,195 A * | 2/1993 | Harpell et al. | ................ | 428/102 |
| 5,198,280 A * | 3/1993 | Harpell et al. | ................ | 428/102 |
| 5,304,413 A * | 4/1994 | Bloom et al. | .................. | 428/215 |
| 5,512,356 A * | 4/1996 | Haager | .......................... | 442/288 |
| 5,677,045 A * | 10/1997 | Nagai et al. | ................... | 442/294 |
| 5,722,927 A * | 3/1998 | Fuchs et al. | .................... | 588/252 |
| 5,741,456 A * | 4/1998 | Ayrton | ........................... | 264/400 |
| 5,750,244 A * | 5/1998 | Christensen et al. | ....... | 428/308.4 |
| 5,827,608 A * | 10/1998 | Rinehart et al. | .............. | 428/332 |
| 5,911,861 A * | 6/1999 | Dubs et al. | .............. | 204/298.27 |
| 6,458,526 B1 * | 10/2002 | Schembri et al. | ................. | 435/4 |
| 6,566,286 B1 * | 5/2003 | Sakaguchi et al. | ............. | 442/281 |
| 6,579,610 B1 * | 6/2003 | Shortland et al. | ............. | 428/323 |
| 6,635,202 B1 * | 10/2003 | Bugg et al. | .................... | 264/45.1 |
| 6,643,564 B2 * | 11/2003 | Kataoka et al. | ............... | 700/258 |
| 6,652,938 B1 * | 11/2003 | Nishikawa et al. | ........... | 428/35.9 |
| 6,662,950 B1 * | 12/2003 | Cleaver | .......................... | 206/710 |
| 6,807,891 B2 * | 10/2004 | Fisher | ........................... | 89/36.02 |
| 6,842,299 B2 * | 1/2005 | Duon et al. | .................... | 359/818 |
| 6,849,339 B2 * | 2/2005 | Dey et al. | ....................... | 428/421 |

(Continued)

*Primary Examiner* — George Nguyen
(74) *Attorney, Agent, or Firm* — Martine Penilla Group, LLP.

(57) ABSTRACT

A carrier structure for supporting a substrate when being processed by passing the carrier through a meniscus formed by upper and lower proximity heads is described. A method of manufacturing the carrier further described. The method includes forming a composite frame having a carbon fiber core, a top sheet, a bottom sheet, a layer of aramid fabric between the top sheet and the core and a second layer of aramid fabric between the bottom sheet and the core. The top sheet and the bottom are each formed from a polymer material. The method further includes forming an opening sized for receiving a substrate and providing a plurality of support pins extending into the opening for supporting the substrate within the opening. The opening is formed slightly larger than the substrate such that a gap exists between the substrate and the opening.

19 Claims, 7 Drawing Sheets

U.S. PATENT DOCUMENTS

| | | | |
|---|---|---|---|
| 7,122,399 B2 * | 10/2006 | Watanabe et al. | 438/106 |
| 7,230,047 B2 * | 6/2007 | Issari | 524/500 |
| 7,374,474 B2 * | 5/2008 | Nishiyama et al. | 451/41 |
| 7,378,359 B2 * | 5/2008 | Eleazer | 442/4 |
| 7,427,444 B2 * | 9/2008 | Rabasco et al. | 428/511 |
| 7,703,462 B2 * | 4/2010 | O'Donnell et al. | 134/95.2 |
| 7,713,890 B2 * | 5/2010 | Vogt et al. | 442/2 |
| 7,946,303 B2 * | 5/2011 | O'Donnell et al. | 134/137 |
| 2004/0241475 A1 * | 12/2004 | Morabito | 428/507 |
| 2005/0178504 A1 * | 8/2005 | Speh et al. | 156/345.21 |
| 2008/0093765 A1 * | 4/2008 | Sartor et al. | 264/103 |

* cited by examiner

METHOD FOR MANUFACTURING A HYBRID COMPOSITE WAFER CARRIER FOR WET CLEAN EQUIPMENT

CLAIM OF PRIORITY

This Application is a Divisional Application, claiming priority from U.S. application Ser. No. 11/743,516, filed on May 2, 2007 now U.S. Pat. No. 8,146,902, which claims the benefit of U.S. Provisional Patent Application having Ser. No. 60/876,631 entitled "Hybrid Composite Wafer Carrier For Wet Clean Equipment," filed on Dec. 21, 2006, both of which are incorporated herein by reference.

CROSS REFERENCE TO RELATED APPLICATIONS

The present Application is related to the following U.S. Patents and U.S. Patent Applications, all of which are incorporated herein by reference in their entirety: U.S. Pat. No. 6,488,040, issued on Dec. 3, 2002 to De Larios, et al. and entitled, "Method And Apparatus For Drying Semiconductor Wafer Surfaces Using A Plurality Of Inlets And Outlets Held In Close Proximity To The Wafer Surfaces;" U.S. patent application Ser. No. 10/330,843, filed on Dec. 24, 2002 and entitled, "Meniscus, Vacuum, IPA Vapor Drying Manifold;" U.S. patent application Ser. No. 10/330,897, also filed on Dec. 24, 2002, entitled, "System For Substrate Processing With Meniscus, Vacuum, IPA Vapor, Drying Manifold;" U.S. patent application Ser. No. 10/404,692, filed Mar. 31, 2003 and entitled, "Methods And Systems For Processing A Substrate Using A Dynamic Liquid Meniscus;" U.S. patent application Ser. No. 10/817,620, which was filed on Apr. 1, 2004, entitled, "Substrate Meniscus Interface And Methods For Operation;" U.S. patent application Ser. No. 11/537,501, which was filed Sep. 29, 2006 and entitled, "Carrier for Reducing Entrance and/or Exit Marks Left By a Substrate-Processing Meniscus;" and U.S. patent application Ser. No. 11/639,752 filed on Dec. 15, 2006 and entitled, "Controlled Ambient System for Interface Engineering."

BACKGROUND

In the semiconductor chip fabrication industry, it is necessary to clean and dry a substrate after a fabrication operation has been performed that leaves unwanted residues on the surfaces of the substrate. Examples of such a fabrication operations include plasma etching (e.g., tungsten etch back (WEB)) and chemical mechanical polishing (CMP). In CMP, a substrate is placed in a holder that pushes a substrate surface against a polishing surface. The polishing surface uses a slurry which consists of chemicals and abrasive materials. Unfortunately, the CMP process tends to leave an accumulation of slurry particles and residues on the substrate surface. If left on the substrate, the unwanted residual material and particles may cause defects. In some cases, such defects may cause devices on the substrate to become inoperable. Cleaning the substrate after a fabrication operation removes unwanted residues and particulates and prevent such defects from occurring.

After a substrate has been wet cleaned, the substrate must be dried effectively to prevent water or cleaning fluid, (hereinafter, "fluid") remnants from leaving residues on the substrate. If the cleaning fluid on the substrate surface is allowed to evaporate, as usually happens when droplets form, residues or contaminants previously dissolved in the fluid will remain on the substrate surface after evaporation and can form spots. To prevent evaporation from taking place, the cleaning fluid must be removed as quickly as possible without the formation of droplets on the substrate surface. In an attempt to accomplish this, one of several different drying techniques are employed such as spin-drying, IPA, or Marangoni drying. All of these drying techniques utilize some form of a moving liquid/gas interface on a substrate surface, which, if properly maintained, results in drying of a substrate surface without the formation of droplets. Unfortunately, if the moving liquid/gas interface breaks down, as often happens with all of the aforementioned drying methods, droplets form and evaporation occurs resulting in contaminants being left on the substrate surface.

Current substrate carriers do not have a desired combination of attributes for conveying a substrate during cleaning and other processing steps such that the formation of droplets on the substrate surface can be avoided. In view of the foregoing, there is a need for improved cleaning systems and methods that provide efficient cleaning while reducing the likelihood of marks from dried fluid droplets.

SUMMARY

Broadly speaking, the present invention fills these needs by providing a carrier structure and method of making same for supporting a wafer during processing by a substrate-processing meniscus.

It should be appreciated that the present invention can be implemented in numerous ways, including as a process, an apparatus, a system, a device, or a method. Several inventive embodiments of the present invention are described below.

In one embodiment, a carrier structure for supporting a substrate when being processed by passing the carrier through a meniscus formed by at least one proximity head is provided. The carrier includes a frame having an opening sized for receiving a substrate and a plurality of support pins for supporting the substrate within the opening, the opening being slightly larger than the substrate such that a gap exists between the substrate and the opening. The frame comprises a composite core, a top sheet, a bottom sheet, a layer of aramid fabric between the top sheet and the core and a second layer of aramid fabric between the bottom sheet and the core. The top sheet and the bottom sheet being formed from a polymer material.

In another embodiment, a method of manufacturing a carrier is provided. The method includes forming a composite frame having a carbon fiber core, a top sheet, a bottom sheet, a layer of aramid fabric between the top sheet and the core and a second layer of aramid fabric between the bottom sheet and the core. The top sheet and the bottom are each formed from a polymer material. The method further includes forming an opening sized for receiving a substrate and providing a plurality of support pins extending into the opening for supporting the substrate within the opening. The opening is formed slightly larger than the substrate such that a gap exists between the substrate and the opening.

In yet another embodiment, a method of making a carrier for use in preparing a substrate is provided. The method includes forming body comprising a core material having a first side and a second side, forming an opening in the body, applying a thermal curing cycle to the body to minimize residual stresses and reduce non-flatness characteristics of the body, and applying a pressure over a top surface and edges of the thermoplastic layers to ensure confinement of the body, and machining the body to define the carrier. The core material has a layer of thermoplastic formed over both the first side and second side of the core material. The opening is sized to receive the substrate. The machining is configured to define dimensions of the opening and outer size parameters of the carrier.

The advantages of the present invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

In the following description, numerous specific details are set forth in order to provide a thorough understanding of the present invention. However, it will be apparent to one skilled in the art that the present invention may be practiced without some of these specific details. In other instances, known process operations and implementation details have not been described in detail in order to avoid unnecessarily obscuring the invention. The term, "meniscus," as used herein, refers to a volume of liquid bounded and contained in part by surface tension of the liquid. The meniscus is also controllable and can be moved over a surface in the contained shape. In specific embodiments, the meniscus is maintained by the delivery of fluids to a surface while also removing the fluids so that the meniscus remains controllable. Furthermore, the meniscus shape can be controlled by precision fluid delivery and removal systems that are in part interfaced with a controller a computing system, which may be networked.

Figure 1A:
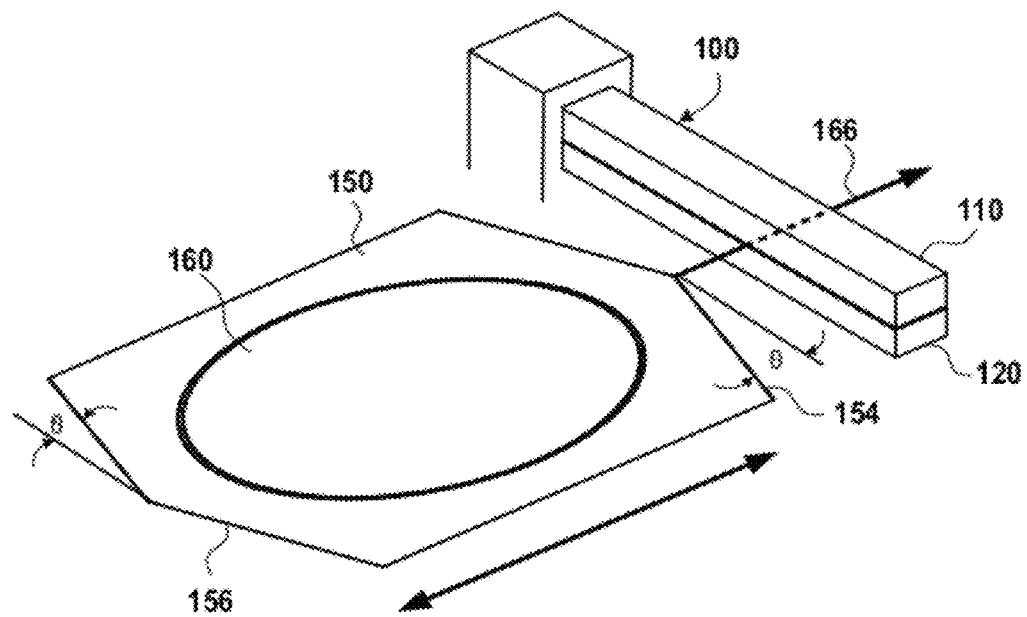
FIG. 1A is a perspective view of an exemplary implementation of a proximity head apparatus.
Figure 1B:
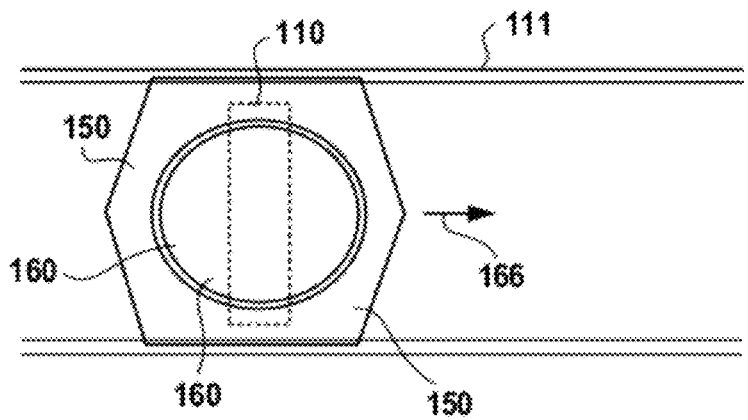
FIG. 1B is a plan view of the exemplary implementation shown in FIG. 1A.

FIG. 1A is a perspective view of an exemplary implementation of a proximity head apparatus 100. FIG. 1B shows the exemplary implantation in plan view. In this example, substrate 160 is positioned within a carrier 150, which comprises a frame having a central opening sized for receiving substrate 160. In this example, the carrier 150 passes between upper proximity head 110 and lower proximity head 120 in the direction of arrow 166. In one embodiment, a single proximity head 110 (e.g., either top or bottom), is used. A meniscus 200 is therefore formed between a surface of the proximity head 110, and the surface of the substrate 160 and surface portions of the carrier 150. For example, the meniscus 200 may be defined to be at least as wide as the diameter of the substrate 160. In another example, the meniscus 200 is slightly larger than the diameter of the substrate 160, such that surface edges of the carrier 150 (e.g., at least surface edges surrounding the circumference of the substrate) are in contact with the meniscus 200. In the illustrated example, the meniscus is formed between upper and lower proximity heads 110, 120. The terms "upper" and "lower" are used to define one example, where the carrier 150 holds and transports the substrate in a substantially horizontal orientation, however other orientations other than horizontal are possible.

Carrier 150 may be conveyed by an apparatus for causing carrier 150 to move between and through the upper and lower proximity heads 110, 120 in the direction of arrow 166. The conveying apparatus, for example, may include track 111 shown in FIG. 1B. Track 111 may be configured to receive the carrier 150 and convey carrier 150 along track 111. Without limitation, the movement of the carrier 150 can be controlled by a motor, screw drives, belt drives, magnetic controllers, etc.

In one embodiment, a substrate 160 is deposited on carrier 150 at a first location on one side of proximity heads 110, 120, and removed when carrier 150 arrives at a second location on an opposite side of proximity heads 110, 120. Carrier 150 may then pass back through proximity heads 110, 120, or over, under, or around proximity heads 110, 120, back to the first location, where a next substrate is deposited, and the process is repeated. The carrier 150 may also be moved through multiple proximity head stations or other processing stations.

Carrier 150 includes a plurality of support pins 152 (shown in FIG. 4), each having substrate support and centering features (not shown), to ensure a uniform carrier-substrate gap 158 between substrate 160 and carrier 150. The gap 158 is controlled so that the meniscus smoothly transitions from the carrier to the wafer, and back to the carrier. In one embodiment, carrier 150 has sloped edges at the leading side 154 and trailing side 156 to prevent abrupt changes in the volume of meniscus liquid as carrier 150 enters and exits the meniscus. For example, carrier 150 has six sides with two leading edges each angled from the transverse direction by an angle θ, e.g., 15°, and together forming a centrally-located point, and corresponding trailing edges each at an angle θ to transverse and together forming a centrally-located point. Other shapes that don't result in a rapid displacement of meniscus liquid are also possible, such as a trapezoid or parallelogram, wherein leading and trailing edges are at an angle other than a right angle to the direction of travel of the carrier or are at an angle to (i.e., not parallel with) the leading and trailing edges of the meniscus 200.

It should be noted that, while in the example shown in FIG. 1, the substrate moves through proximity heads 110, 120 in the direction of arrow 166, it is also possible for the substrate to remain stationary while the proximity heads 110, 120, pass over and under the substrate, provided the substrate moves with respect to the proximity heads. Furthermore, the orientation of the substrate as it passes between the proximity heads is arbitrary. That is, the substrate is not required to be oriented horizontally, but can instead be vertically oriented or oriented at any angle.

In certain embodiments, a controller 130, which may be a general purpose or specific purpose computer system whose functionality is determined by logic circuits, software, or both, controls the movement of carrier 150 and the flow of fluids to upper and lower proximity heads 110, 120. The fluids can be supplied from facilities of a clean room, or from containers.

Figure 2:
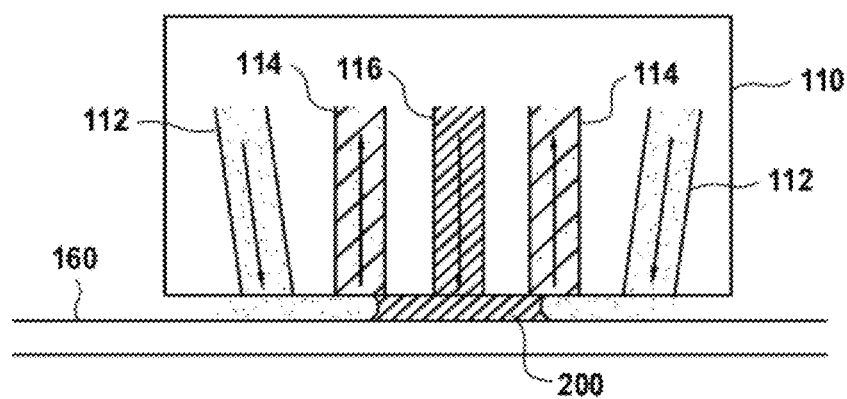
FIG. 2 shows a schematic representation of upper proximity head.

FIG. 2 shows a schematic representation of upper proximity head 110, which is a minor image of lower proximity head 120 (FIG. 1). Each proximity head includes a plurality of central nozzles 116 through which a liquid is supplied that forms meniscus 200. The liquid may be deionized water, a cleaning solution, or other liquid designed to process, clean, or rinse substrate 160. A plurality of vacuum ports 114 apply a vacuum at a perimeter of meniscus 200. Vacuum ports 114 aspirate liquid from meniscus 200 and surrounding fluid, such as air or other gas supplied by nozzles 112. In certain embodiments, nozzles 112 may be provided that surround or partially surrounds vacuum ports 114 and supply isopropyl alcohol vapor, nitrogen, a mixture thereof, or other gas or two-phase gas/liquid fluid. The nozzles 112 and fluid supplied therefrom aid in maintaining a coherent liquid/gas interface at the surface of meniscus 200. More details relating to proximity head structure and operation are incorporated by reference in the Cross Reference to Related Art section above. In particular, U.S. patent application Ser. Nos. 10/261,839, 10/330,843, and 10/330,897 are referenced for additional details relating to proximity head structure and operation.

Figure 3A:
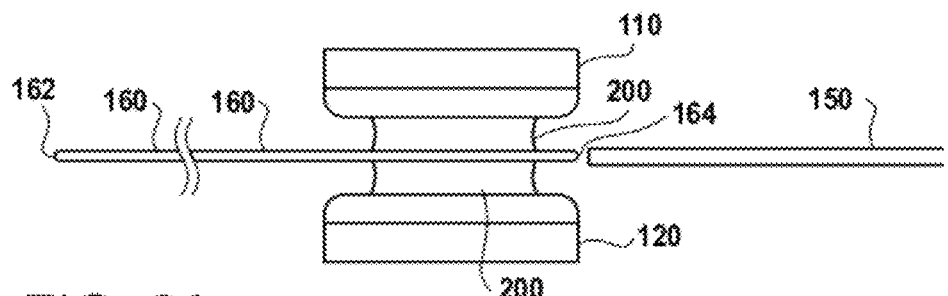
FIGS. 3A, 3B, and 3C illustrate a substrate exiting a meniscus generated by upper and lower proximity heads.
Figure 3B:
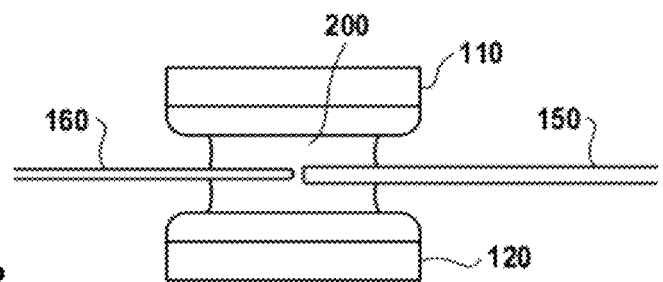
Figure 3C:
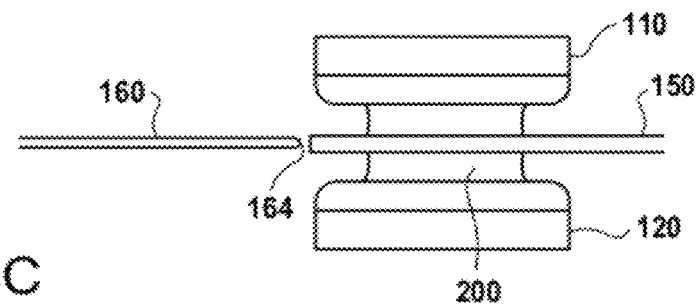

FIGS. 3A through 3C illustrate a substrate 160 passing through and exiting meniscus 200 generated by upper and lower proximity heads 110, 120. In these Figures, substrate 160 and carrier 150 are moving to the left with respect to upper and lower proximity heads 110, 120. At the point shown in FIG. 3A, substrate 160 extends all the way through meniscus 200 such that leading edge 162 and trailing edge 164 of substrate 160 lie on opposite sides of meniscus 200 and leading edge 232 of meniscus 200 is approaching trailing edge 164 of substrate 160. It should be noted that, typically, substrate 160 will be circular and while carrier 150 is shown outside of meniscus 200, parts of carrier 150 may be in contact with meniscus 200, although not visible in this Figure.

In FIG. 3B, meniscus 200 is transitioning from substrate 160 to carrier 150. At this point, trailing edge 164 is inside meniscus 200. In one embodiment, carrier 150 may be slightly thicker in cross section than substrate 160. For example, substrate 160 may be about 0.80 mm thick whereas the carrier may be about 1.5 mm thick. Thus, as meniscus 200 transitions onto carrier 150, a certain amount of meniscus liquid is displaced by carrier 150. In FIG. 3C, the meniscus has completely transitioned off of substrate 160 and onto carrier 150.

Figure 4:
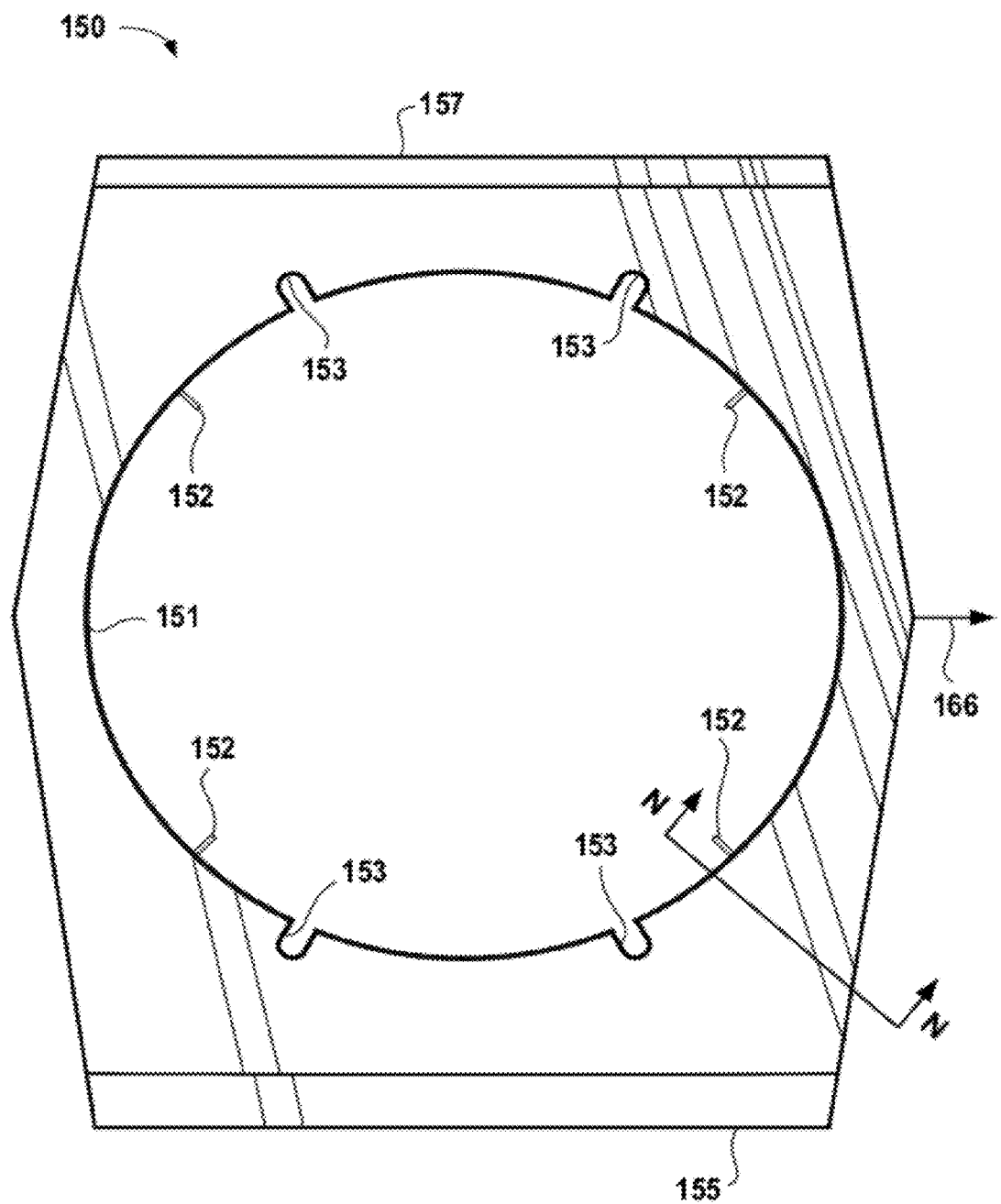
FIG. 4 shows by way of example a plan view of a wafer carrier.

FIG. 4 shows by way of example a plan view of wafer carrier 150. Wafer carrier 150 is generally flat with an opening 151 sized for receiving a wafer for processing. The wafer may be supported on a plurality of pins 152. In one embodiment, four pins 152 are provided for supporting a wafer within opening 151. Carrier 150 may also include a plurality of notches 153 for providing access to a wafer handling equipment. For example, a picker or end effector of a robot arm used to deposit a wafer within carrier 150 or retrieve a wafer from carrier 150 can include fingers that extend in notches 153 and then slide underneath the wafer so that the wafer can then be lifted, or the handling equipment may grip the wafer from the edges at the location of notches 153. In another embodiment, the wafer may be lifted from underneath carrier 150 by a first device (not shown) and then removed by a picker or end effector of a robot arm, in which case notches 153 are not needed.

Figure 5:
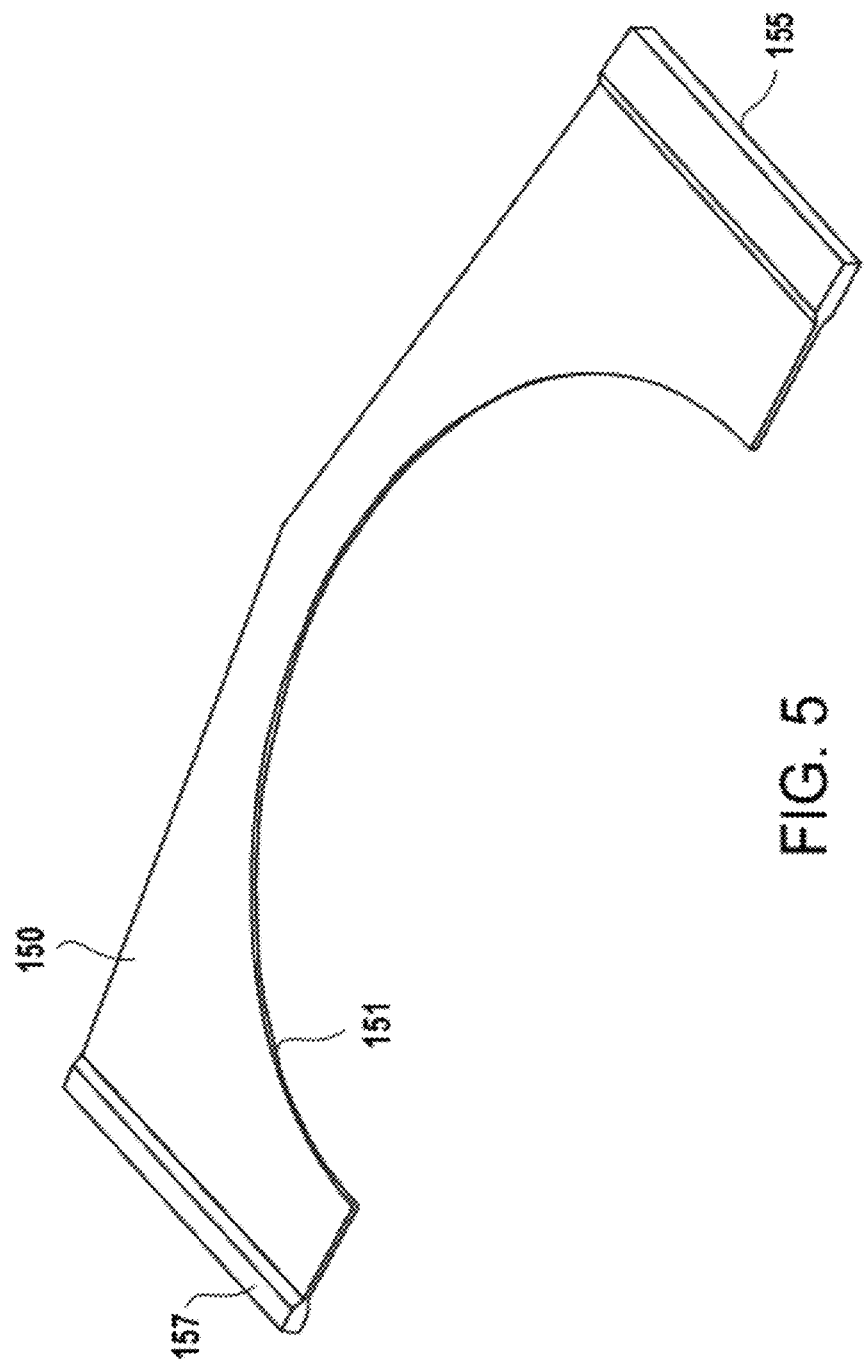
FIG. 5 shows a perspective cross-section view of the wafer carrier of FIG. 4.

Carrier 150 also includes thickened edges 155, 157 along the carrier's left and right edges to provide increased mechanical stability. Thickened portions 155, 157 can be seen more clearly in the perspective cross-section view shown in FIG. 5. In one embodiment, thickened edges 155, 157 may be used for clamping or securing to a conveyor apparatus (not shown). In another embodiment, thickened edges contain embedded magnets for securing carrier 150 to a conveyor system.

Since carrier 150 supports a wafer as it passes through a meniscus which may be only about 2-3 millimeters thick, it is important that it be thin, flat, and rigid, so as to minimize vertical deflection, i.e., deflection perpendicular to the surface of carrier 150. It may also be desirable that the carrier be resistant to corrosive chemicals used in wet wafer processing such as hydrofluoric acid (hydrogen fluoride solution). In one embodiment, the carrier is about 1.5 millimeters thick except at the thickened portions along thickened edges 155, 157. In one embodiment, carrier 150 is held in tension with left and right edges being biased away from each other by the conveyor apparatus to increase the carrier's rigidity and reduce vertical deflection. In another embodiment, carrier 150 is created with a slight arch so that when it carries the weight of a wafer or other substrate, it flattens out for minimal deviation from the plane. It is also possible to do both, i.e., it is possible to provide a slight arch for improved flatness under load while also maintaining the carrier in tension to further reduce vertical deflection.

Figure 6:
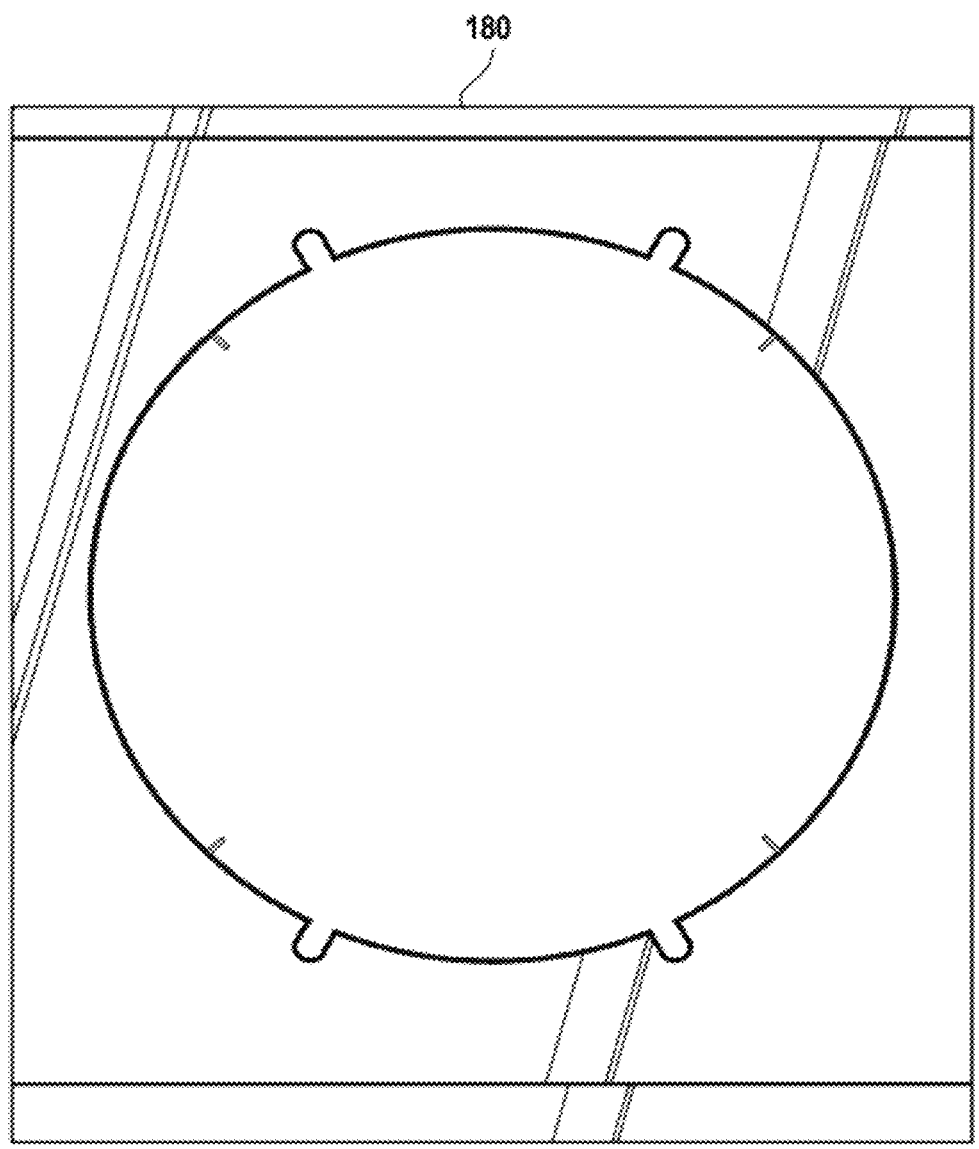
FIG. 6 shows by way of example a plan view of a carrier having a rectangular shape.

FIG. 6 shows a carrier 180 having a rectangular design more suitable for being placed in tension, thereby reducing vertical deflection. As mentioned previously, other shapes are possible, such as a trapezoid shape for providing both a shape that can be placed in tension in the transverse direction, i.e., with left and right edges biased away from each other, while at the same time minimizing rapid displacement of meniscus fluid as the carrier enters the meniscus 200.

Figure 7:
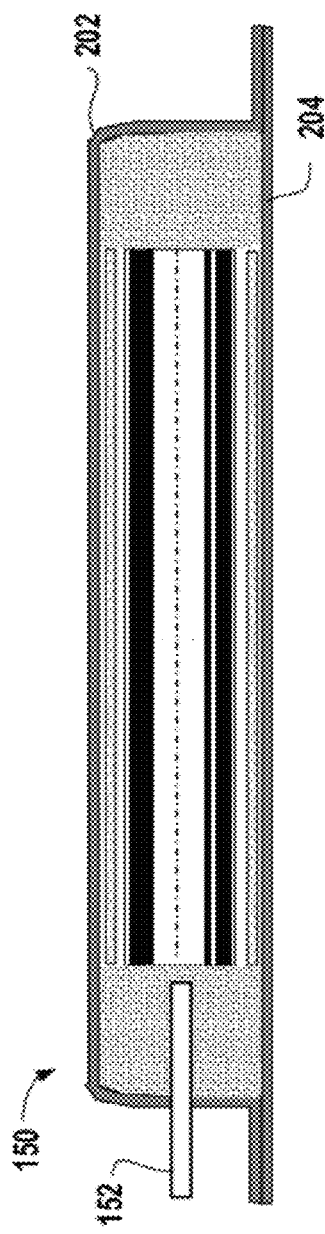
FIG. 7 shows by way of example, a cross section view of carrier along line N-N in FIG. 4, with the vertical dimension exaggerated for clarity.

FIG. 7 shows a cross section view of carrier 150 along line N-N in FIG. 4, with the vertical dimension exaggerated for clarity. In one embodiment, carrier 150 includes an external covering having a top sheet 202 and a bottom sheet 204 formed from a thermoplastic material such as polyvinylidene fluoride. Sheets of polyvinylidene fluoride suitable for use in carrier 150 are available under the trade name "Kynar" from Arkeme, Inc. of Philadelphia, Pa. Materials other than polyvinylidene fluoride are also contemplated. Such materials should be mechanically and chemically stable or inert when exposed to harsh chemical environments. In addition, it is desirable for the external material to be configurable to a desired hydrophobicity to aid in maintaining the integrity of meniscus 200 (FIGS. 2-3C). That is, in some processes, a hydrophobic carrier is desired whereas in other processes, a more hydrophilic carrier is desired. Materials such as polyvinylidene fluoride can be prepared by abrading or polishing to tune the hydrophobicity to a desired level. Top and bottom sheets 202, 204 can be sealed together using known thermoplastic welding techniques or by adhesives. The thickness of the top and bottom sheets 202, 204 may be adjusted to balance the life cycle and flatness requirements of carrier 150.

Figure 8:
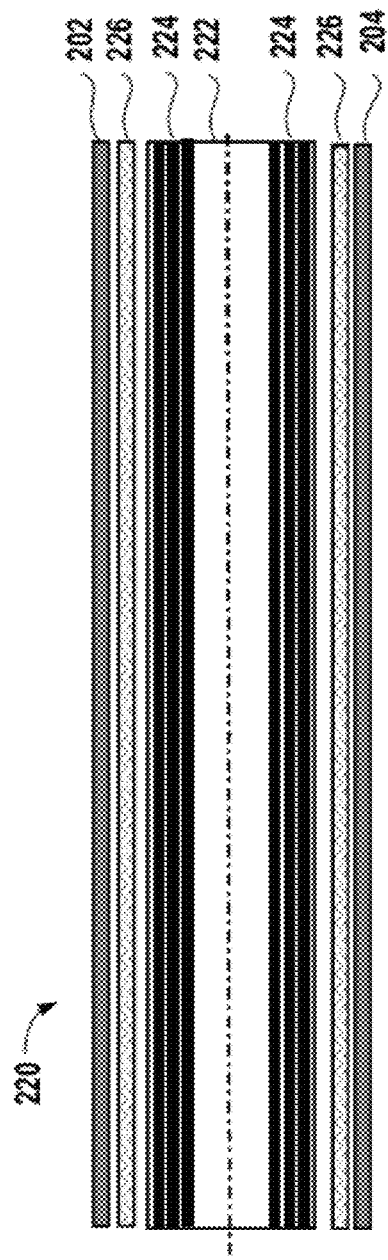
FIG. 8 shows in detail the layered structure of the carrier cross section of FIG. 7.

Carrier 150 also includes a layered structure 220 shown in FIG. 8. The layered structure is formed from a composite core 222, and pre-impregnated layers 224, 226. In addition, a filler material 228, which may be formed from polyvinylidene fluoride powder or rods, may be provided. In one embodiment, composite core 222 includes molded carbon fiber reinforced composite, e.g., with an epoxy matrix. Above and below composite core 222 is one or more layers of unidirectional pre-impregnated (prepreg) carbon fiber epoxy composite 224. Instead of the molded composite core 222, multiple layers of carbon fiber reinforce composite sheeting may be employed. The unidirectional pre-impregnated composite may be oriented with the fibers extending perpendicularly to the left and right edges 155, 157 (FIG. 4). Suitable carbon-fiber reinforced epoxy is widely available in pre-impregnated form. Other materials having a high strength to weight ratio may also be considered in place of carbon-fiber reinforced epoxy. Between composite fabric layers 224 and top and bottom sheets 202, 204 is a layer of aramid fabric 226. Aramid fabrics are widely available commercially for use in laminates. Aramid fabrics are also widely available in pre-impregnated form with different weaving patterns. Fabrics formed from aramid fiber benefit from the fiber's high strength and modulus of elasticity, providing exceptional stiffness to the carrier structure. Other materials may be suitable in place of aramid fabrics. Such a material should be sufficiently rigid enough to provide support of the substrate while being transferred between one or two opposing proximity heads. Some fabrics, such as aramid fabrics, may be pre-tensioned so that it does not substantially flex or sag with the cutout. For example, such pretensioning may be analogous to stretching fabric across a drumhead. Materials, such as SiC, may not be as well suited to being pretensioned in this manner. This reinforcement layer should, in one embodiment, also have chemical compatibility with hydrogen fluoride, and other corrosive chemicals.

In one embodiment, pins 152 (only one shown in FIG. 6) is embedded into fill material 224. In one embodiment, pins 152 are made of polyvinylidene fluoride or polyetheretherketones (PEEK). Other rigid, corrosion-resistant materials may also be contemplated for forming pins 152.

In one embodiment, wafer carrier 150 may be produced by stacking a layer of polyvinylidene fluoride sheeting, a layer of aramid fabric, a composite core comprising uni-directional carbon fiber reinforced epoxy, another layer of aramid fabric and another layer of polyvinylidene fluoride sheeting. For more precise shape forming of the edges and corners, including thickened edges 155, 157 (FIGS. 4, 5) powder of polyvinylidene fluoride may be spread around the core of aramid layers. In one embodiment, magnets (not shown) are embedded in thickened edges 155, 157 for use with a magnetic conveyor. In another embodiment, thickened edges are formed by a molded piece (not shown) having an interlocking feature such as a slot to engage core 222 or composite fabric layers 224, if core 222 is not present. The molded edge pieces may be formed of polyvinylidene fluoride by injection or extrusion molding and/or machining Other suitable materials and methods for forming thickened edges 155, 157 are also contemplated.

Pressure may then be applied to the top and all edges of the carrier to ensure confinement and flatness. In one embodiment, the pressure plates are formed with recesses to mold thickened edges 155, 157. In addition, pressure plates may be formed with a slight arch to create an arched carrier that flattens under the load of carrying a wafer. Of course, other shape-forming features may be formed into the pressure plates.

In one embodiment, while pressure is still applied, the stack may be subjected to a thermal curing cycle to sinter or bind filler material 228, minimize residual stress and ensure flatness. In one embodiment, the thermal cycle includes heating the structure to the melting temperature of the polyvinylidene fluoride, i.e., approximately 340° F. (171° C.). As is generally known, depending on the particular oven used, calibration curves may be established between the oven and part temperatures for consistency in the result. After the curing cycle, the carrier may be machined to final dimensions, and then the surface modified to a specific roughness required for desired hydrophobicity. In another embodiment, the stack is subjected to a thermal cycling to reduce residual stress, and separately heated to the melting point of polyvinylidene fluoride.

In one embodiment, pins 152 (FIG. 4, 6) are molded in place prior to thermal cycling as shown in FIG. 7. The manufactured carrier provides light-weight, high strength, and stiffness to the carrier that minimizes vertical deflection which is critical to the wet clean process. The carrier is also highly resistant to hydrofluoric acid and contamination from other cleaning constituents, byproducts, and material removed from the substrate. The polyvinylidene fluoride and aramid fabric composites used to encapsulate the core composite structure allow surface modification capable of tuning the hydrophobicity of the material for drying performance. The hybrid construction of the composite carrier provides added advantages of damage tolerance during handling and vibration damping of the carrier when transporting and cleaning wafers.

Figure 9:
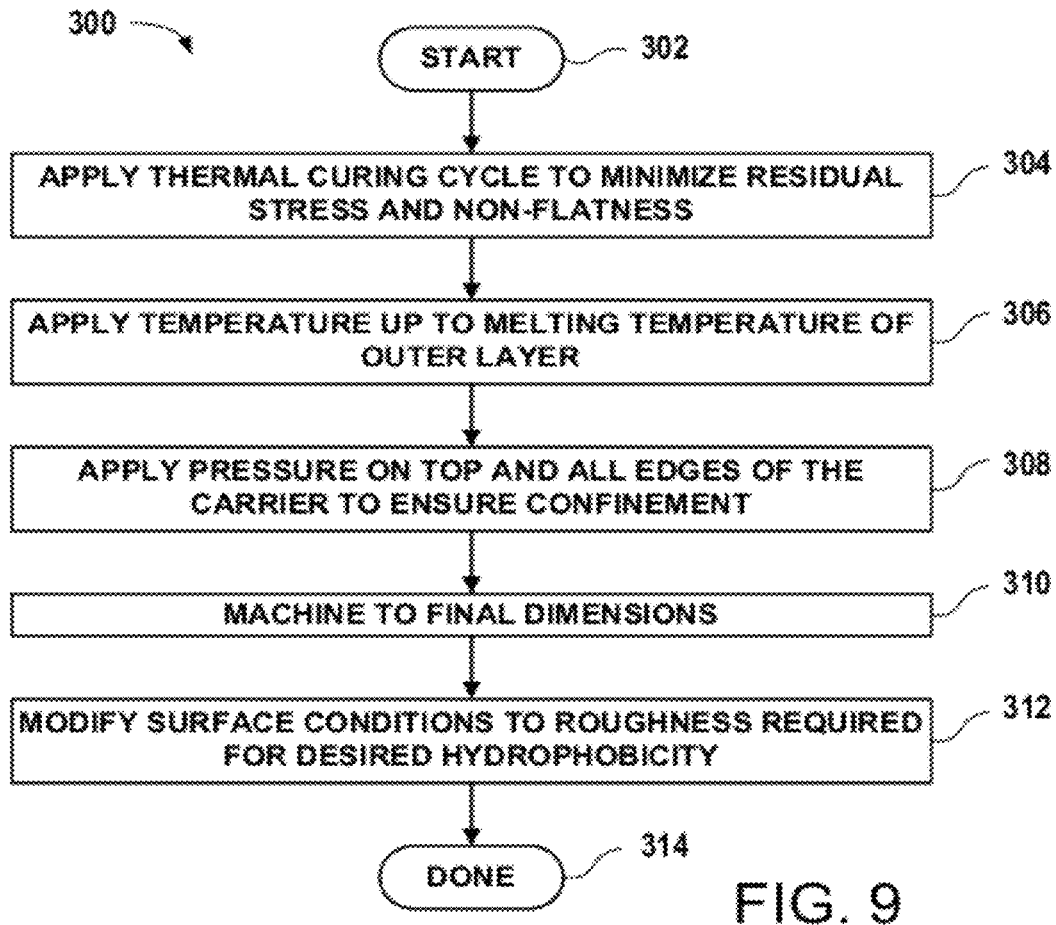
FIG. 9 shows a flowchart illustrating an exemplary composite molding process for manufacturing the carriers of FIGS. 4-8.

FIG. 9 shows a flowchart 300 illustrating an exemplary composite molding process for manufacturing carrier 150. It should be noted that these procedural steps are not necessarily performed in the order indicated and some procedural steps may be made concurrently with one another. The procedure begins as indicated by start block 302 and proceeds to operation 304 wherein a thermal curing cycle is applied to minimize residual stress and non-flatness. By "non-flatness" it is meant a vertical deviation from the design. The design may incorporate a slight arch as described above so that under the weight of a wafer or other substrate it flattens.

In operation 306, a temperature up to the melting temperature of the outer layers is applied. This operation may be combined with operation 304. In one embodiment, the outer layers are formed by polyvinylidene fluoride, which has a melting temperature at about 340° F. (171° C.). Depending on the oven used, calibration curves may be established between the oven and part temperatures.

In operation 308, pressure is applied on the top and all edges of the carrier to ensure confinement. The pressure may be applied concurrently with thermal cycling.

In operation 310, the carrier is machined to final dimensions. Optionally, in operation 312, the surface conditions may be modified to the roughness required for the desired hydrophobicity. The method of making then ends as indicated by done block 314.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of manufacturing a carrier for supporting a substrate processed by passing the carrier through a meniscus formed by a proximity head, the method comprising:

forming a composite frame of a carbon fiber core, a top sheet, a bottom sheet, a layer of aramid fabric between the top sheet and the carbon fiber core and a second layer of aramid fabric between the bottom sheet and the carbon fiber core, the top sheet and the bottom sheet being formed from a polymer material, the frame having an opening sized for receiving a substrate, the frame also having a plurality of support pins extending into the opening in a parallel orientation relative to a surface of the top sheet and the bottom sheet, the plurality of supporting pins defined for supporting the substrate within the opening, the opening being slightly larger than the substrate such that a gap exists between the substrate and the opening.

2. The method of claim 1, wherein the frame is formed with a slight arch so that when the frame is under the load of carrying a substrate, the frame substantially flattens out for minimal vertical displacement from a plane.

3. The method of claim 1, wherein the carbon fiber core has an epoxy matrix.

4. The method of claim 3, wherein the carbon fiber is further formed by adding least one layer of uni-directional pre-impregnated carbon fiber material above and below the carbon fiber core.

5. The method of claim 4, wherein carbon fibers of the unidirectional pre-impregnated carbon fiber material are oriented perpendicular to left and right edges of the carrier, the left and right edges extending in a direction of travel of the carrier.

6. The method of claim 1, wherein the top sheet and bottom sheet are formed of polyvinylidene fluoride.

7. The method of claim 1, wherein the aramid fabric is pre-impregnated with epoxy.

8. The method of claim 1, further comprising molding the carbon fiber with thickened left and right edges to provide increased mechanical stability, the left and right edges extending in a direction of travel of the carrier.

9. The method of claim 1, wherein the carrier further comprises a filler material formed from thermoplastic powder that is sintered or binded during a thermal cycling treatment during manufacture of the carrier.

10. The method of claim 1, wherein the support pins are formed from one of polyvinylidene fluoride or polyetheretherketone.

11. The method of claim 1, wherein the composite frame is shaped to have six sides.

12. The method of claim 11, wherein of the six sides, a first side and a second side are parallel to each other and have thickened edges, third and fourth sides and fifth and sixth sides are respectively defined between the first side and the second side, wherein third, fourth, fifth and sixth sides are angled away from a perpendicular direction defined from the first side or the second side.

13. A method of making a carrier for use in preparing a substrate, comprising:
    forming body comprising a core material having a first side and a second side, the core material having a layer of thermoplastic formed over both the first side and second side of the core material;
    forming an opening in the body, the opening being sized to receive the substrate and defined with a plurality of pins, the plurality of pins extending into the opening in a parallel orientation relative to a surface of the first and second sides of the body;
    applying a thermal curing cycle to the body to minimize residual stresses and reduce non-flatness characteristics of the body;
    applying a pressure over a top surface and edges of the thermoplastic layers to ensure confinement of the body; and
    machining the body to define the carrier, the machining being configured to define dimensions of the opening and outer size parameters of the carrier.

14. The method of making a carrier for use in preparing a substrate as recited in claim 13, wherein the machining further includes,
    shaping specific portions of the layer of thermoplastic.

15. The method of making a carrier for use in preparing a substrate as recited in claim 13, shaping parts of the body to define the edges of the body.

16. The method of making a carrier for use in preparing a substrate as recited in claim 13, wherein the thermal curing cycle uses a temperature that is up to a melting point of the thermoplastic layers of the first side and the second side.

17. The method of making a carrier for use in preparing a substrate as recited in claim 13, further comprising:
    modifying a surface roughness of the layer of thermoplastic to obtain a desired hydrophobicity.

18. The method of making a carrier for use in preparing a substrate as recited in claim 13, wherein the body is shaped to have six sides.

19. The method of making a carrier for use in preparing a substrate as recited in claim 18, wherein of the six sides, a first side and a second side are parallel to each other and have thickened edges, third and fourth sides and fifth and sixth sides are respectively defined between the first side and the second side, wherein third, fourth, fifth and sixth sides are angled away from a perpendicular direction defined from the first side or the second side.

\* \* \* \* \*